(12) United States Patent
Martin et al.

(10) Patent No.: US 6,352,399 B1
(45) Date of Patent: Mar. 5, 2002

(54) TWIN TOWER WAFER BOAT LOADING SYSTEM AND METHOD

(75) Inventors: John M. Martin; Arthur W. Harrison, both of Mesa, AZ (US)

(73) Assignee: Amtech Systems, Inc., Tempe, AZ (US)

( * ) Notice: Subject to any disclaimer, the term of this patent is extended or adjusted under 35 U.S.C. 154(b) by 0 days.

(21) Appl. No.: 09/348,997

(22) Filed: Jul. 7, 1999

(51) Int. Cl.[7] ............................................. B65G 25/04
(52) U.S. Cl. ...................... 414/156; 414/938; 414/940; 414/804; 414/806; 414/282; 118/500; 432/239
(58) Field of Search ................................ 414/281, 282, 414/217, 217.1, 222.01, 935, 940, 804, 806, 937, 939, 156, 160, 277, 619, 663, 664, 668; 118/719, 500; 432/239

(56) References Cited

U.S. PATENT DOCUMENTS

| | | | |
|---|---|---|---|
| 3,930,587 A | * 1/1976 | Bliss | 414/664 |
| 4,405,277 A | 9/1983 | Bürkner et al. | 414/222 |
| 4,669,938 A | 6/1987 | Hayward | 414/156 |
| 4,701,096 A | 10/1987 | Fisher, Jr. | 414/416 |
| 4,722,659 A | 2/1988 | Hoyt, III et al. | 414/416 |
| 4,728,246 A | 3/1988 | Mello | 414/592 |
| 4,872,799 A | 10/1989 | Fisher, Jr. | 414/180 |
| 4,888,994 A | 12/1989 | Nakamaki et al. | 73/760 |
| 4,954,079 A | 9/1990 | Yamaga | 432/6 |
| 5,032,053 A | 7/1991 | Krieg | 414/278 |
| 5,069,591 A | * 12/1991 | Kinoshita | 414/156 |
| 5,131,799 A | 7/1992 | Nishi et al. | 414/416 |
| 5,284,412 A | 2/1994 | Shiraiwa et al. | 414/277 |
| 5,356,261 A | 10/1994 | Nishi | 414/404 |
| 5,374,153 A | 12/1994 | Nishi | 414/417 |
| 5,405,232 A | * 4/1995 | Lloyd et al. | 414/282 X |
| 5,409,348 A | 4/1995 | Suzuki | 414/786 |
| 5,501,564 A | 3/1996 | Doche | 414/331 |
| 5,547,537 A | 8/1996 | Reynolds et al. | 156/351 |
| 5,611,422 A | 3/1997 | Harkonen | 198/681 |
| 5,634,760 A | * 6/1997 | Anderson et al. | 414/277 X |
| 5,636,724 A | 6/1997 | Scheler et al. | 198/375 |
| 5,765,982 A | 6/1998 | Martin et al. | 414/156 |
| 5,839,870 A | * 11/1998 | Niemirowski et al. | 414/156 X |

FOREIGN PATENT DOCUMENTS

| | | | | |
|---|---|---|---|---|
| FR | 2587692 | * | 3/1987 | 414/282 |
| JP | 62-128523 | * | 6/1987 | 414/156 |
| JP | 63-142630 | * | 6/1988 | 414/156 |
| JP | 4-62859 | * | 2/1992 | 414/940 |
| WO | 094004447 | * | 3/1994 | 414/282 |

* cited by examiner

*Primary Examiner*—Frank E. Werner
(74) *Attorney, Agent, or Firm*—Cahill, Sutton & Thomas P.L.C.

(57) ABSTRACT

An apparatus for automatically and simultaneously loading a single long wafer boat or a plurality of wafer boats onto a cantilever paddle includes a stationary first track aligned with a first opening of a diffusion furnace and a first carriage moveable on the first track. The first carriage supports a cantilever paddle. A first vertical translation mechanism includes a first stationary part and a first vertically moveable support. A second vertical translation mechanism includes a second stationary part and a second vertically moveable support. A first horizontal translation mechanism includes a first base supported by the first vertically moveable support and a first horizontally moveable arm supported by the first base. A second horizontal translation mechanism includes a second base supported by the second vertically moveable support and a second horizontally moveable arm supported by the second base. A horizontal support apparatus is adapted to support the long wafer boat or plurality of wafer boats each loaded with semiconductor wafers. The support apparatus includes a first end supported by the first horizontally moveable arm and a second end supported by the second horizontally moveable arm.

28 Claims, 7 Drawing Sheets

TWIN TOWER WAFER BOAT LOADING SYSTEM AND METHOD

BACKGROUND OF THE INVENTION

The invention relates to a system for automatically and simultaneously loading a plurality of boat loads of semiconductor wafers into a semiconductor diffusion furnace.

Commonly assigned U.S. Pat. No. 5,765,982 by Martin et al., issued Jun. 16, 1998 is incorporated by reference herein, and is believed to be representative of the closest prior art. FIG. 1A of U.S. Pat. No. 5,765,982 shows a furnace loading station 10. A queue mechanism 30 having a stationary base is loaded with 6 to 8 boatloads of semiconductor wafers 26. The queue mechanism 30 shifts the right hand boatload of wafers to an index position at the right end of queue mechanism 30 such that a pair of horizontal elevator tines 38 of a vertical elevator mechanism 34 can pick up one boatload of wafers at a time in the manner of a fork lift, raise them upward in the direction of arrows 60 into alignment with one of a number of horizontal loading assemblies such as 14 and 16. Each loading assembly includes a carriage such as 20 or 42 which moves horizontally on a track toward a semiconductor furnace tube located in a furnace cabinet on the right hand side of furnace loading station 10 so that 6 to 8 boatloads of wafers supported on either a horizontal cantilever paddle such as 47 or in a horizontal cantilever diffusion tube such as 21 can be inserted into the hot zone of a corresponding furnace tube.

A horizontal robotic mechanism 37 is supported by vertical elevator 34. Horizontal robotic mechanism 37 supports the tines 38 which pick up one boatload of wafers and moves them horizontally in the direction of arrows 39 to position each boatload of wafers, one at a time, over the paddle 47, lower it onto the paddle 47. After 6 to 8 boatloads of wafers have been loaded onto cantilever paddle 47, the carriage 42 supporting the paddle 47 moves in the direction of arrow 59 into the hot zone of the corresponding furnace tube. The entire operation is controlled by a programmed computer or control system 29 that controls the various described moving mechanisms.

A major shortcoming of the foregoing system of U.S. Pat. No. 5,765,982 is that the process of loading and unloading each cantilever paddle 47 with 6 to 8 boatloads of wafers one at a time, inserting them all at once into and withdrawing them all at once from the furnace tube, the unloading of the processed boatloads of wafers one at a time and depositing them back on the queue mechanism 30 is very time-consuming. A typical prior art loading station 10 includes four loading assemblies such as 16, so 24 to 32 boatloads of wafers have to be transferred one at a time from queue mechanism 30 and loaded one at a time onto the cantilever paddles 47 prior to processing them in the furnace tube. After processing they then must be unloaded from paddles 47 one at a time and returned to queue mechanism 30. This may require a total of more than 15 minutes. The mechanism 30 in U.S. Pat. No. 5,765,982 is undesirably complex and slow.

Other prior art exists which provides an intermediate carrier that can support 6 to 8 boatloads of wafers and load all 6 to 8 boatloads in a single pass onto a cantilever paddle such as 47 in U.S. Pat. No. 5,765,982. Most such prior art systems use complex 5-axis articulated mechanisms to support the intermediate carrier and the 6 to 8 boatloads of wafers on it. Both the hardware and software of these systems are more complex and expensive than is desirable.

SUMMARY OF THE INVENTION

Accordingly, it is an object of the invention to provide an automatic wafer boat loading system which reduces the amount of time required to load a plurality of boatloads of semiconductor wafers into a semiconductor diffusion furnace and to later unload them from the furnace.

It is another object of the invention to provide an automatic wafer boat loading system which avoids the need for separate operations to load a plurality of wafer boats, one at a time, onto a cantilever paddle.

It is another object of the invention to provide an automatic wafer boat loading system which avoids generation of particulates due to abrasion that results from imprecise placement of loader wafer boats on a cantilever paddle.

It is another object of the invention to provide an automatic wafer boat loading system which reduces the number of loading and unloading cycles required to load a plurality of boatloads of wafers into a diffusion furnace and later unload them from the furnace.

It is another object of the invention to provide an automatic wafer boat loading system which is operable using relatively simple software.

It is another object of the invention to provide a system for simultaneously loading a plurality of boatloads of wafers into a furnace tube without introducing an excessive amount of additional thermal mass and physical mass into the furnace tube in order to avoid disturbing semiconductor process parameters within the furnace tube.

Briefly described, and in accordance with one embodiment thereof, the invention provides an apparatus for automatically and simultaneously loading a "long" wafer boat or a plurality of wafer boats onto a cantilever paddle, and automatically and/or simultaneously unloading the loaded wafer boats from the cantilever paddle. The apparatus includes a stationary first track aligned with a first opening of a furnace, and a first carriage moveable on the first track, the first carriage supporting a first cantilever paddle. A first vertical translation mechanism includes a first stationary part and a first vertically moveable support. A second vertical translation mechanism includes a second stationary part and a second vertically moveable support. A first horizontal translation mechanism includes a first base supported by the first vertically moveable support and a first horizontally moveable arm supported by the first base. A second horizontal translation mechanism includes a second base supported by the second vertically moveable support and a second horizontally moveable arm supported by the second base. A horizontal support apparatus is adapted to support the wafer boat or boats each loaded with semiconductor wafers. The support apparatus includes a first end supported by the first horizontally moveable arm and a second end supported by the second horizontally moveable arm.

In one embodiment, the horizontal support apparatus includes a first wafer boat edge lift mechanism having a first end supported by the first horizontal arm mechanism and a second end supported by the second horizontal arm mechanism. The first wafer boat edge mechanism includes at least a first retractable boat edge engaging member. The horizontal support apparatus also includes a second wafer boat edge lift member having a first end supported by the first horizontal arm mechanism and a second end supported by the second horizontal arm mechanism. The second wafer boat edge lift member includes at least a second retractable boat edge lift member. The first and second retractable edge engaging members are extendable to engage opposite edges of the loaded wafer boat or boats to support and set boat or boats directly on the cantilever paddle by movement of the first and second horizontal arm mechanisms in the first and second vertical translation mechanisms. The first and second retractable boat edge engaging members are retractable to allow withdrawal of the first and second horizontal arm mechanisms from the vicinity of the loaded wafer boat or boats on the cantilever paddle.

In another embodiment, the horizontal support apparatus includes an intermediate carrier having first and second ends removably supported by the first and second horizontally moveable arms, respectively. The plurality of loaded wafer boats rests on the intermediate carrier, the intermediate carrier with the plurality of wafer boats thereon being adapted to be gently set on the cantilever paddle by movement of the first and second horizontal arm mechanisms in cooperation with movement of the first and second vertical translation mechanisms. In another embodiment, a single long wafer boat includes end features by which the long wafer boat is directly supported by the first and second horizontal arm mechanisms, without use of an intermediate carrier.

DETAILED DESCRIPTION OF THE PREFERRED EMBODIMENTS

Figure 1A:
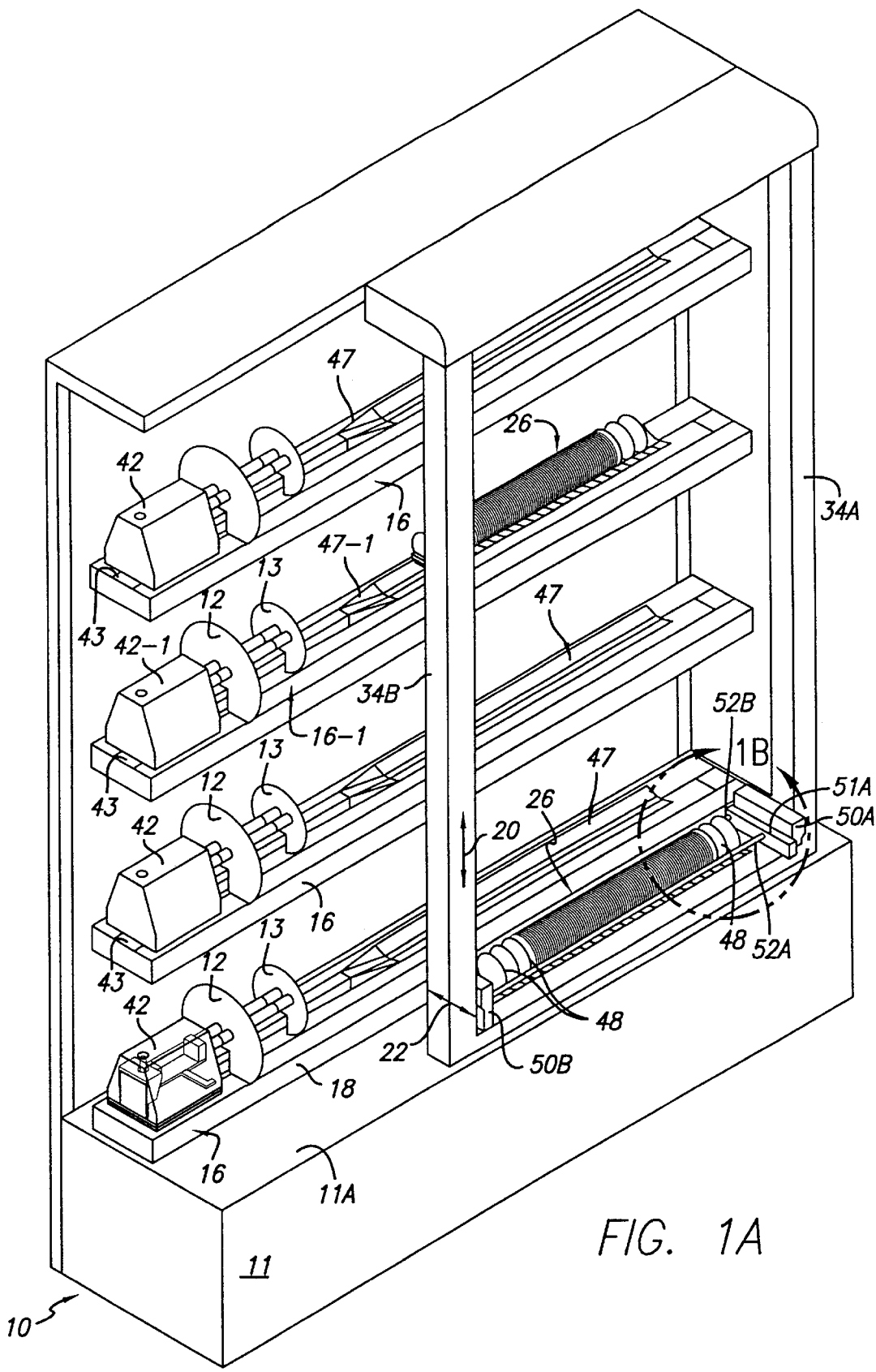
FIG. 1A is a perspective view of an automatic wafer boat loading system with a plurality of boatloads of wafers ready to be transported to and set down on one of a plurality of silicon carbide cantilever paddles.

Referring to FIGS. 1A–1F, automatic wafer boat loading station 10 includes four conventional loading mechanisms 16, similar to those described in above mentioned U.S. Pat. No. 5,765,382. Each loading mechanism 16 includes a carriage 42 horizontally moveable on a longitudinal track 43. Each loading mechanism 16 supports a horizontal cantilevered silicon carbide paddle 47 that supports 6 to 8 "standard" wafer boats loaded with semiconductor wafers (i.e., about 150 to 200 wafers) along with additional cylindrical devices called "baffle boats". Baffle boats include baffle disks that are provided to establish the desired gas flow patterns in the furnace tube. In FIG. 1A, a group of boatloads of semiconductor wafers 26 are shown on cantilever paddle 47-1, ready to be carried into the hot zone of a diffusion furnace tube by the cantilever paddle 47-1 and carriage 42-1. Another group of wafer boats loaded with semiconductor wafers 26 is shown loaded onto a subsequently described wafer boat transporting mechanism, and is ready to be loaded onto another one of the available cantilever paddles 47. The silicon carbide cantilever paddles 47 herein do not need to have a slot such as the one designated by numeral 47A in U.S. Pat. No. 5,765,982.

Alternatively, a single large wafer boat of the kind commonly referred to as a "long boat", rather than six to eight "standard" wafer boats can be supported on a cantilever paddle 47 and carried by it into the hot zone of the furnace tube. A typical "standard" wafer boat carries either 25 or 50 semiconductor wafers, and a typical "long boat" carries 150 or 300 semiconductor wafers.

Automatic wafer boat loading station 10 of FIGS. 1A–1F includes two vertical elevator systems, rather than only one as in the prior art. In FIG. 1A, the two vertical elevator systems are designated by numerals 34A and 34B, and are also referred to as "vertical translation mechanisms" 34A and 34B, respectively.

Loading station 10 also includes two horizontal translation mechanisms 50A and 50B, which themselves are moveable vertically in the directions of arrows 20 by vertical elevator mechanisms 34A and 34B, respectively. Horizontal translation mechanisms 50A and 50B are also referred to as "Y-drives" 50A and 50B, respectively. Horizontal translation mechanisms 50A and 50B include horizontally moveable arms 51A and 51B, respectively, which each are moveable horizontally in the directions of arrows 22.

Figure 1B:
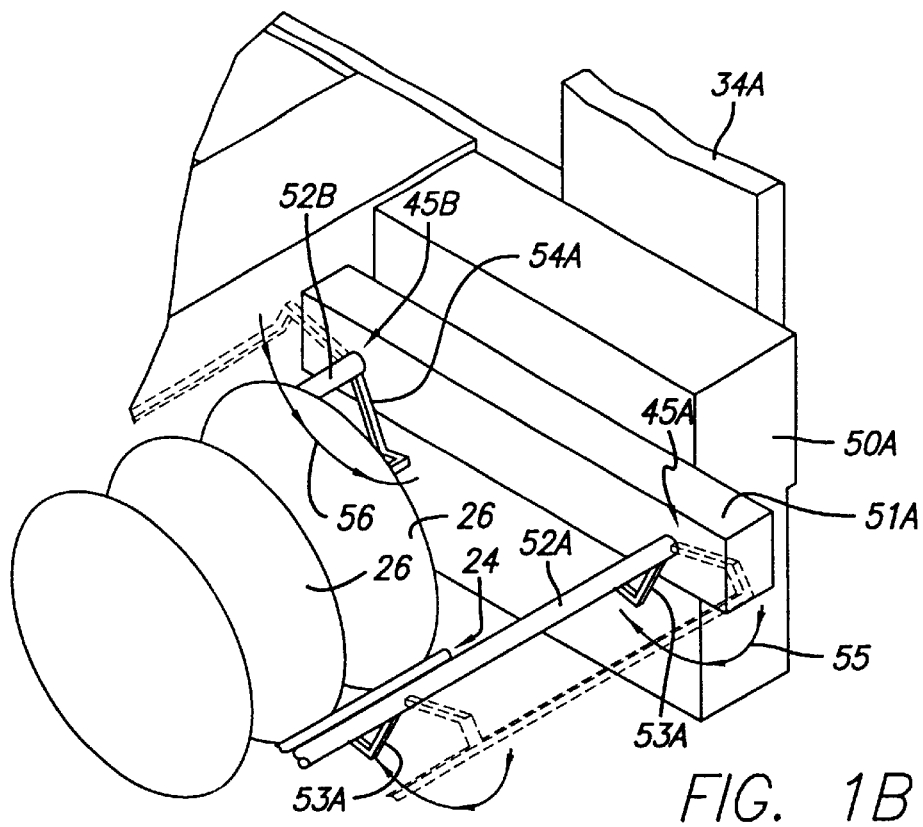
FIG. 1B is an enlarged perspective view of a portion of the system shown in FIG. 1.
Figure 1C:
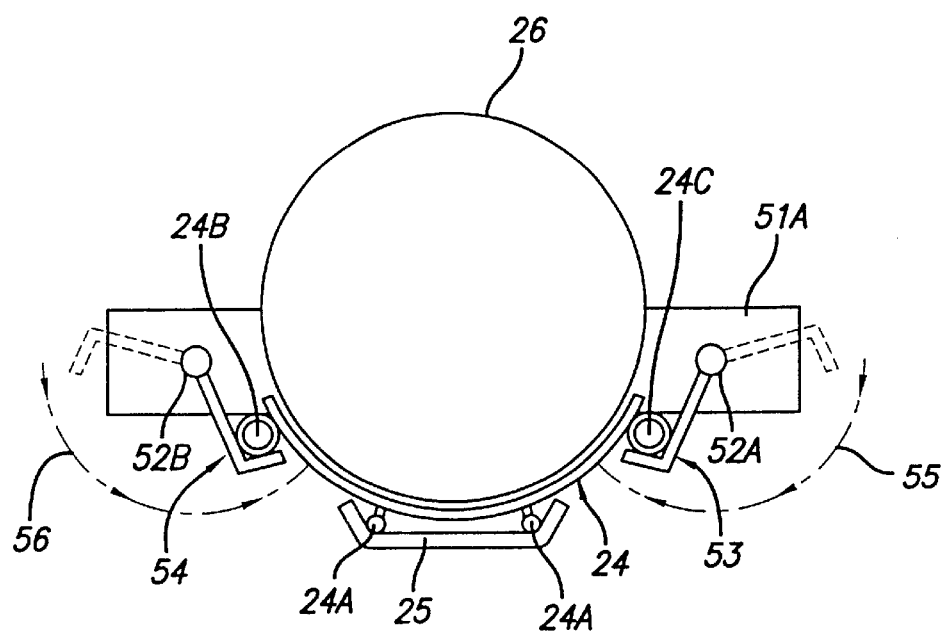
FIG. 1C is a partial section view useful in describing the operation of the system in FIG. 1A.
Figure 1D:
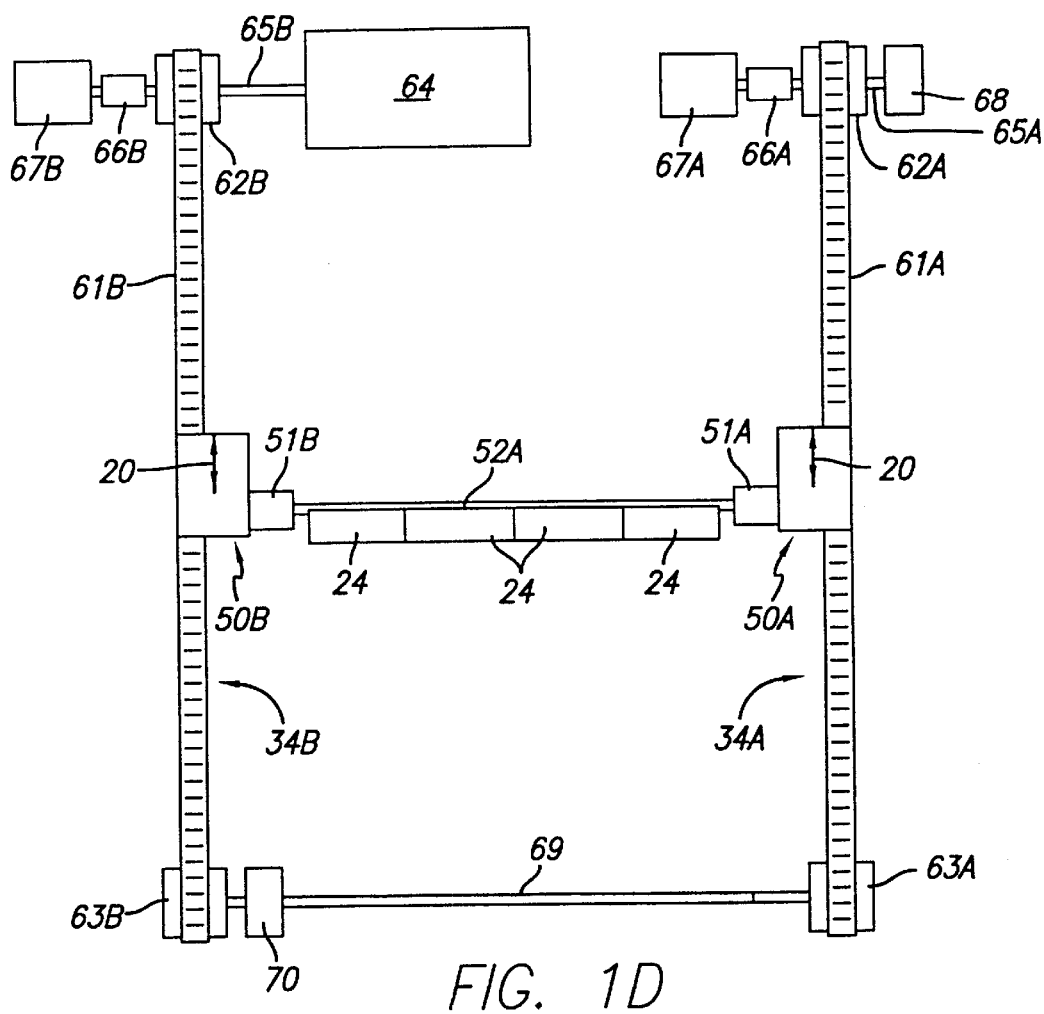
FIG. 1D is a simplified front elevational view of the drive mechanisms in the two elevators in FIG. 1A.

FIG. 1D illustrates the vertical translation mechanisms included in elevators 34A and 34B of FIG. 1A. Belt 61A, idler pulleys 62A and 63A, encoder 68, over-running coupling 66A, and slip clutch 67A are included in elevator 34A. Similarly, vertical belt 61B, idler pulley 63B, encoder 70, drive pulley 62B, motor and drive assembly 64, over-running coupling 66B and slip clutch 67B are included in the vertical translation mechanism in elevator 34B.

Y-drive mechanism 50A is supported on belt 61A and is carried vertically in the directions of arrows 20. Drive pulley 62B is driven by motor and drive assembly 64 in response to control signals 29B from microcontroller 29 of FIG. 1G. Y-drive mechanism 50B is attached to belt 61B. Belt 61B is carried vertically in the directions of arrows 20 by drive pulley 62B and imparts an identical rotation to idler pulley 63B.

Rotary encoder 70 in FIG. 1D provides, for example, 1000 equally spaced counts per inch of vertical movement of belt 61B, and generates corresponding signals on one of conductors 29A applied to the input of microcontroller 29. Belt 61A is driven by idler pulley 63A, to which horizontal translation mechanism 50A is attached. Belt 61A imparts the same rotation to idler pulley 62A, which turns rotary encoder 68. Encoder 68 provides 1,000 counts per inch of movement of belt 61A, and provides corresponding signals on one of conductors 29A as an input to microcontroller 29. Using such information, microcontroller 29 of FIG. 1G continuously monitors the vertical positions of Y-drives 50A and 50B and the horizontal positions of horizontally moveable arms 51A and 51B to ensure that the Y-drives 50A and 50B are at the same elevation.

Over-running couplings 66A and 66B together with adjustable slip clutches 67A and 67B perform the function of, in effect, "counter-balancing" the weight of the loaded wafer boats, Y-drive mechanisms 50A and 50B, and wafer boat support apparatus, which combined may weigh from about 30 pounds to about 50 pounds. That weight is supported by only one side of each of belts 61A and 61B, and needs to be offset to prevent excessive vertical drift of the 20 to 50 pounds supported by one side of belts 41A and 61B.

In operation, over-running couplings 66A and 66B decouple adjustable slip-clutches 67A and 67B from rotary shafts 65A and 65B while the weight of Y-drives 50A and 50B and the wafer boats supported thereby are being lifted. When the Y-drives 50A and 50B and wafer boats supported thereby are being lowered, over-running couplings 66A and 66B connect shafts 65A and 65B to slip-clutches 67A and 67B, respectively, which then act as brakes to counter lowering of the weight of Y-drives 50A and 50B and the wafer boats supported thereby. This avoids the need for use of massive counterbalancing weights on the opposite sides of belts 61A and 61B from the Y-drives 50A and 50B.

Slip-clutch mechanisms 67A and 67B each include a stationary, non-rotational plate, and a rotary plate coupled to shaft 65A or 65B, by overrunning coupler 66A or 66B, respectively, and act as controllable friction brakes to offset the 30 to 50 pound weight on one side of belts 61A or 61B. Over-running couplings 66A and 66B thereby prevent the drift or back-rotation of pulleys 62A and 62B due to the weight of the mass connected to one side of each of belts 61A and 61B. Slip clutches are enclosed to contain any particulates generated by the friction therein.

Referring to FIG. 1B, horizontal translation mechanisms 50A and 50B include wafer boat edge engaging mechanisms 45 and 46, respectively, that typically lift six to eight conventional boats loaded with semiconductor wafers 26. Or, a single conventional long boat loaded with 150 or 300 semiconductor wafers could be engaged and lifted by wafer boat edge engaging mechanisms 45A and 45B. The wafer boat edge engaging mechanisms 45A and 45B also lift several baffle boats 48 at opposite ends of the group of six to eight boatloads of wafers (which are used to establish uniform process gas flow around the boatloads of wafers). Thus, the system including vertical elevators 34A and 24B and the two horizontal translation mechanisms 50A and 50B and associated wafer boat edge engaging mechanisms 45A and 45B can carry six to eight standard wafer boats (or one long boat) loaded with wafers and associated baffle boats to any of the four silicon carbide cantilever paddles 47 in a single pass.

Figure 1E:
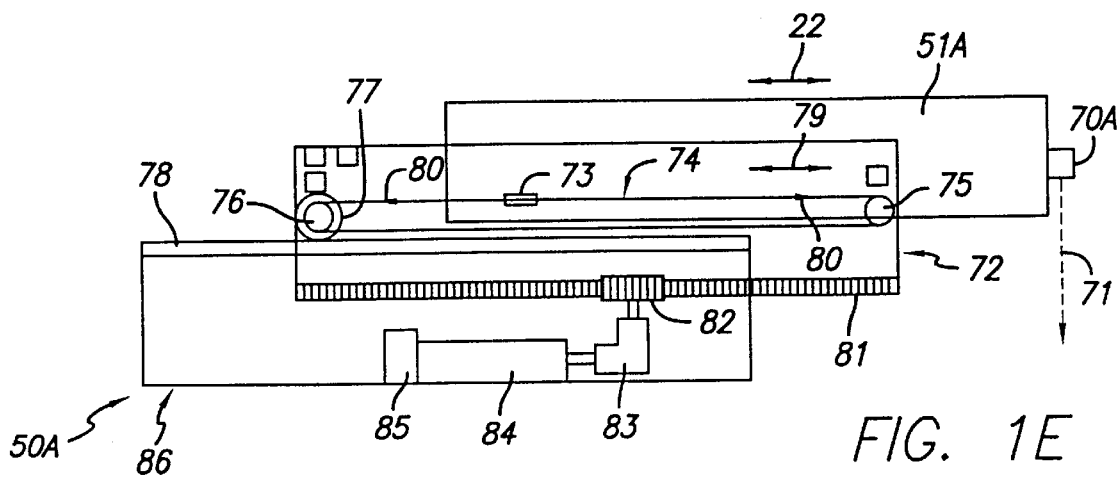
FIG. 1E is a simplified side elevational view of part of a Y-drive mechanism of a horizontal translation mechanism in FIG. 1A.
Figure 1F:
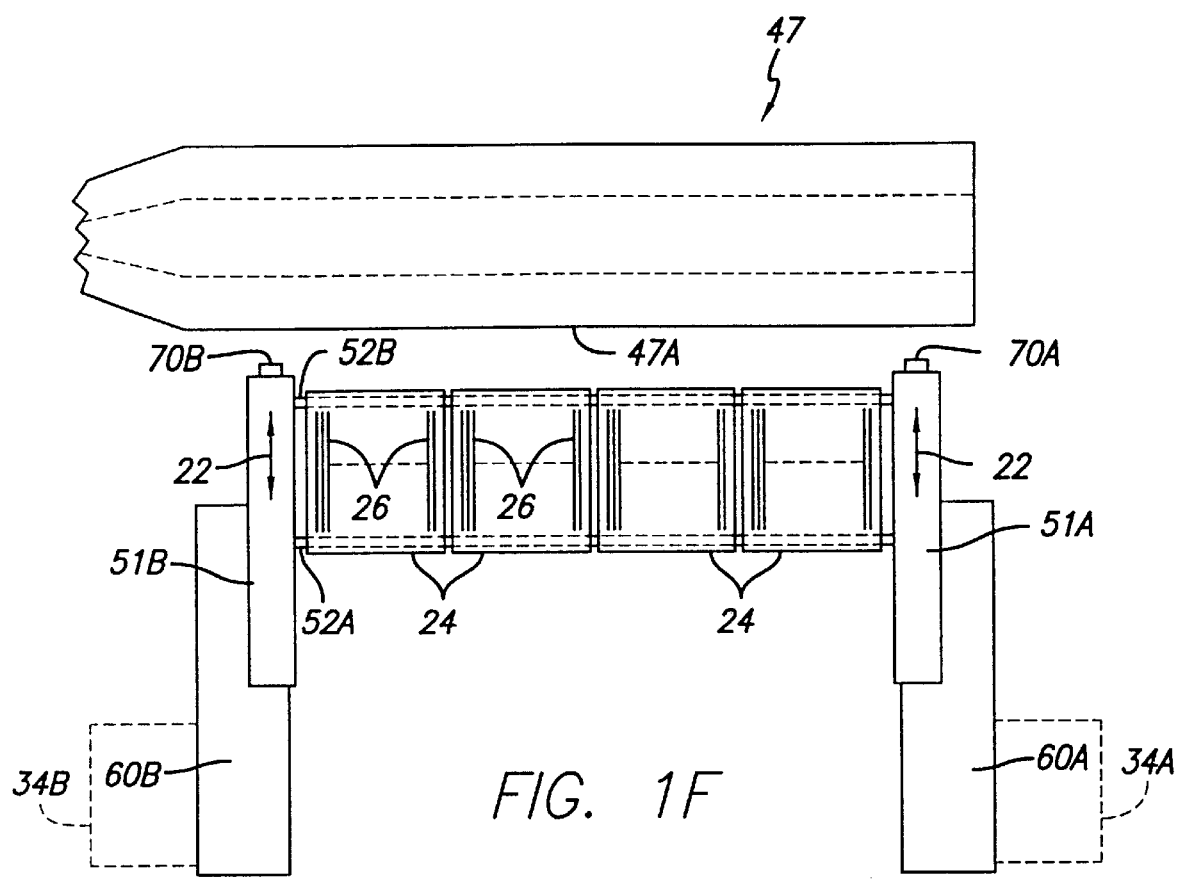
FIG. 1F is a plan view diagram illustrating the cantilever paddle edge sensors and operation used to simultaneously and automatically align a plurality of boatloads of semiconductor wafers with the cantilever paddle.
Figure 1G:
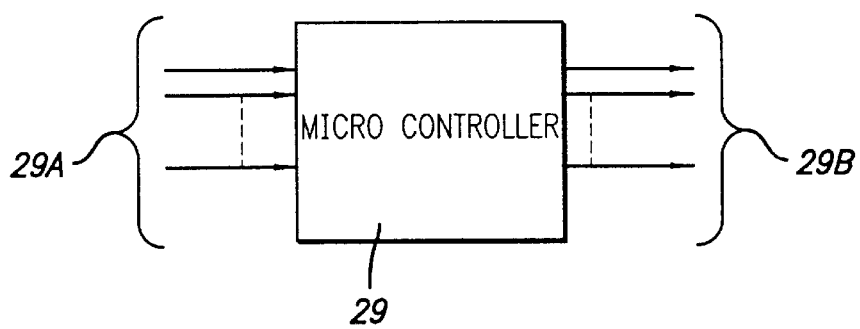
FIG. 1G is a block diagram of a programmed microcontroller connected to various sensors, actuators, motors, and switches involved in operation of the automatic wafer boat loading system of FIGS. 1A–F.

FIGS. 1E and 1F show partial detail of Y-drive or horizontal translation mechanism 50A, including horizontally moveable arm 51A. An optical sensor 70A is attached to the outer end of horizontally moveable arm 51A, and emits a beam 71 downward as indicated by the dotted line arrow 71. When the outer edge of horizontally moveable arm 51A passes over the front edge of cantilever paddle 47, beam 71 is reflected back to sensor 70A, which causes it to transmit a signal to programmed microcontroller 29. This, in conjunction with the signals produced by the encoder 85 of horizontal translation mechanism 50A, indicates precisely the location of horizontally moveable arm 51A at the time it moves over the front edge 47A of cantilever paddle 47, as shown in FIG. 1F.

A similar optical sensor 70B on the outer edge of horizontally moveable arm 51B senses the edge of cantilever paddle 47 and transmits a signal to microcontroller 29. This, in conjunction with the signals produced by encoder 85 of horizontal translation mechanism 50B, indicates precisely the location of horizontally moveable arm 51A at the time it moves over the front edge 47A of cantilever paddle 47, as shown in FIG. 1F.

Microcontroller 29 uses the positional information from the two encoders 85 of the two horizontal translation mechanisms and the edge sensors thereof to compute any offset correction needed to adjust the relative positions of horizontally moveable arms 51A and 51B as necessary to make the wafer boats held thereby precisely parallel to the longitudinal axis of cantilever paddle 47. Microcontroller 29 can use the information from sensors 70A and 70B and the positional information from encoders 85 of the two Y-drives 50A and 50B in various ways to accomplish accurate alignment of the wafer boats carried by horizontally moveable arms 51A and 51B with cantilever paddle 47 before lowering the wafer boats onto it. For example, microcontroller 29 can independently advance each of the horizontally moveable arms 51A and 51B the known precise amount of distance from the edge of cantilever paddle 47 to the longitudinal axis thereof. Or, microcontroller 29 can stop whichever horizontally moveable arm first reaches the edge of cantilever paddle 47, wait for the other one to catch up, and then advance them together into alignment with the horizontal axis of cantilever paddle 47.

Microcontroller 29 thus adjusts the relative positions of horizontally moveable arms 51A and 51B as they independently advance further over cantilever paddle 47 to the precise location along the Y direction at which four to six wafer boats are to be loaded onto or unloaded from cantilever paddle 47. At that location the longitudinal axis of the cantilever paddle 47 is precisely aligned with the longitudinal axes of the six to eight wafer boats 24.

Still referring to FIG. 1E horizontaly moveable arm 51A is supported on a suitable precision track by an intermediate horizontally moveable arm 72 that moves in the directions of arrows 79. Intermediate horizontally moveable arm 72 is supported on a suitable precision track on a base 86 that is attached to and carried vertically upward or downward by belt 61A. Base 86 includes a drive motor 84 which drives a right angle transmission 83. Transmission 83 drives a pinion gear 82 which engages a rack gear 81 on horizontally moveable intermediate arm 72. Therefore, as motor 84 operates, it causes intermediate horizontally moveable arm 72 to move in one of the directions indicated by arrow 79.

A second rack gear 78 is attached to the upper surface of base 86. A pinion gear 77 is rotatably supported on horizontally moveable intermediate arm 72, causing it to rotate as intermediate horizontally moveable arm 72 moves in the direction of one of arrows 79 as a result of operation of motor 84. A pulley 76 is mounted axially with and attached to pinion gear 77. Pulley 76 carries a belt 74 which is also supported by an idler pulley 75 at the opposite end of horizontally moveable intermediate arm 72. A coupler 73 connects a point on belt 74, which moves in one of the directions of arrows 80, to horizontally moveable arm 51A, causing it to move in one of the directions of arrows 22 in response to operation of motor 84.

Rotary encoder 85 provides 10,000 equally spaced counts per inch of movement of horizontally moveable arm 51A in the direction of arrows 22, and sends signals indicative of the position of horizontally moveable arm 51A to microcontroller 29, which then generates control signals to control motor 84 via one of conductors 29B.

The structure and operation of Y-drive mechanism 50B are essentially identical to those of Y-drive mechanism 50A.

Referring to FIGS. 1A–1C and 2A–2C, rods 52A and 52B rotate to cause wafer boat edge engaging members 45A and 45B to pivot so as to engage edge support rails 24B and 24C of opposite edges of each wafer boat 24, as indicated by arrows 55 and 56 in FIGS. 1B and 1C. The wafer boat support rails 24B and 24C of each wafer boat 24 can be placed directly on V-shaped intersections formed by boat edge-support arms (FIG. 2B) of edge engaging member 53 and V-shaped intersections formed by boat edge support arms 54C,54D. The outer ends of boat edge-support arms 53D are stabilized by member 53B, and the outer edges of boat edge support arms 54D are stabilized by member 54B.

The V-shaped intersections formed by boat edge-support arms 53C,53D and boat edge-support arms 54C,54D ensure that the wafer boats 24 are accurately aligned with horizontally moveable arms 51A and 51B when the wafer boat support rails 24B and 24C rest in the V-shaped intersections.

Microcontroller 29 then causes motor assembly 64 of FIG. 1D to operate belts 61A and 61B to raise the horizontal translation devices 50A and 50B and the four to six loaded wafer boats 24 supported thereby to a level slightly above that of a "destination" cantilever paddle 47, with the wafer boat edge-support arms remaining in the boat-supporting configuration indicated by the solid lines in FIGS. 1B and 1C.

Figure 2A:
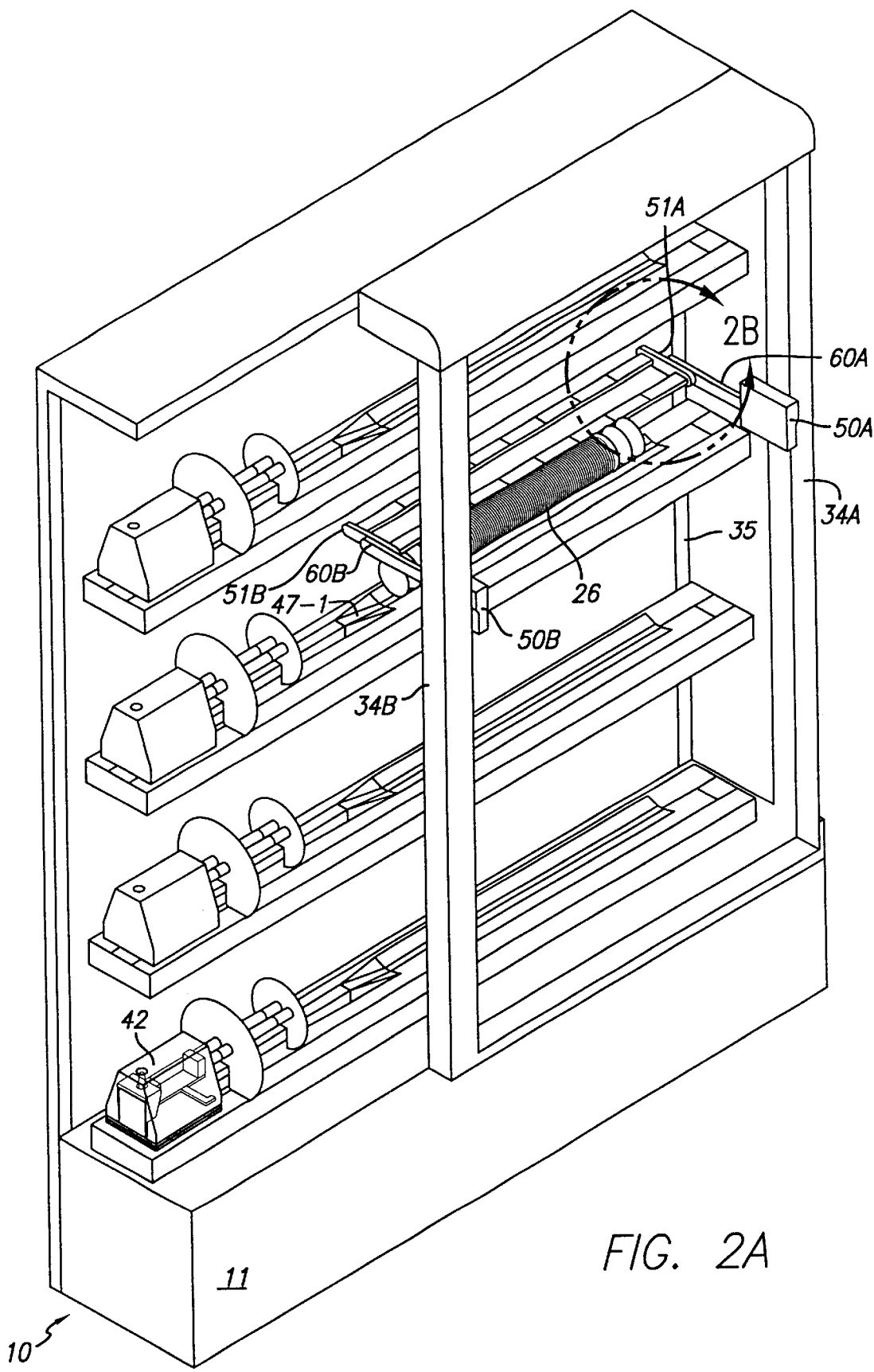
FIG. 2A is a perspective view of the system of FIG. 1 showing a mechanism positioned to lift a plurality of boatloads of wafers from a silicon carbide cantilever paddle.
Figure 2B:
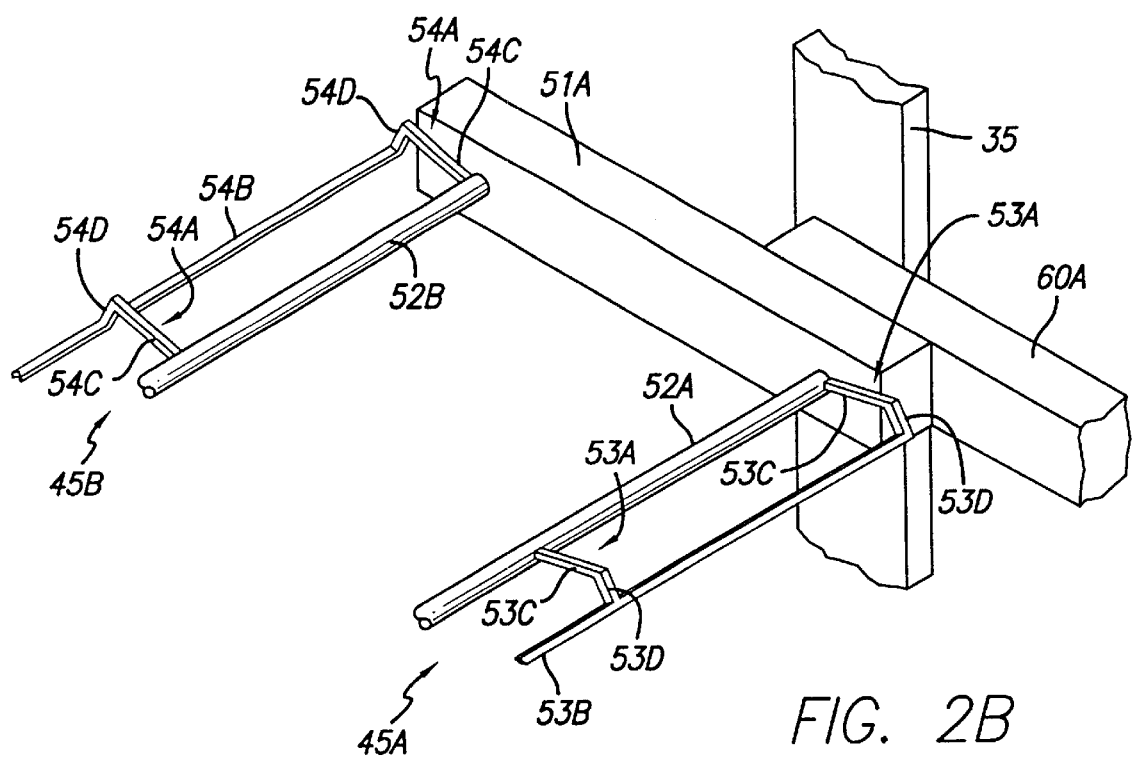
FIG. 2B is an enlarged perspective view of a portion of the system as shown in FIG. 2A.

Next, microcontroller 29 operates to move horizontally moveable arms 51A and 51B and the loaded wafer boats supported thereby over the destination cantilever paddle, for example cantilever paddle 47-1, as shown in FIG. 2A. Microcontroller 29 also adjusts for any needed offset correction as previously described to ensure that the wafer boats are precisely aligned with the longitudinal axis of cantilever paddle 47-1. Control software of the system 29 causes horizontal translation mechanisms 50A and 50B to perfectly align the six to eight boatloads of wafers over the cantilever paddle 47, and then gently lower them onto cantilever paddle 47 without any abrasion. This is important because it prevents generation of microscopic particulates which, if present, cause imperfections on the integrated circuits being formed and thereby reduce processing yields. Microcontroller 29 then operates motor assembly 64 of FIG. 1D to gently rest the wafer boats 26 onto cantilever paddle 47-1.

Figure 2C:
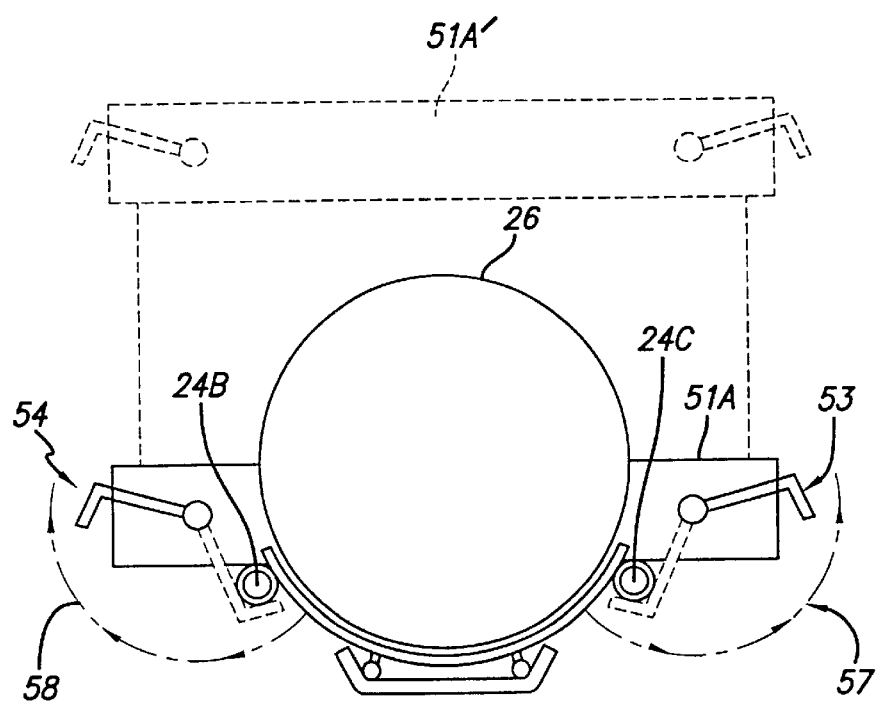
FIG. 2C is a partial section view useful in describing the operation of unloading a plurality of boatloads of wafers from a paddle as shown in FIG. 2A.

Microcontroller 29 then rotates rods 52A and 523 to pivot edge-support arms 53C,53D and 54C,54D so they swing clear of wafer boats 24, as indicated by arrows 57 and 58 in FIG. 2C. Microcontroller 29 then operates elevators 34A and 34B to raise horizontal translation mechanisms 50A and 50B so that horizontally moveable arms 51A and 51B, the wafer edge support mechanisms 53 and 54, and rods 52A and 52B completely clear wafers 26. Microcontroller 29 then operates the horizontal translation mechanisms 50A and 50B to horizontally withdraw moveable arms 51A and 51B to their "home" positions, and then operates elevators 34A and 34B to return horizontal translation mechanisms 50A and 50B to pick up another group of typically four to six loaded standard wafer boats or a single long boat to be loaded onto another cantilever paddle 47.

After all of the wafers 26 have been loaded onto cantilever paddles 47, moved into corresponding furnace tubes, processed, and withdrawn by the various carriages 43, the wafer boat loading/unloading mechanism then is operated in the reverse order from that described above to remove each group of loaded wafer boats from the cantilever paddle 47 and return each group to the location shown in FIG. 1A. All of the wafer boats of each group then can be carried away by an operator, or, if available, an automated shuttle machine.

Figure 3:
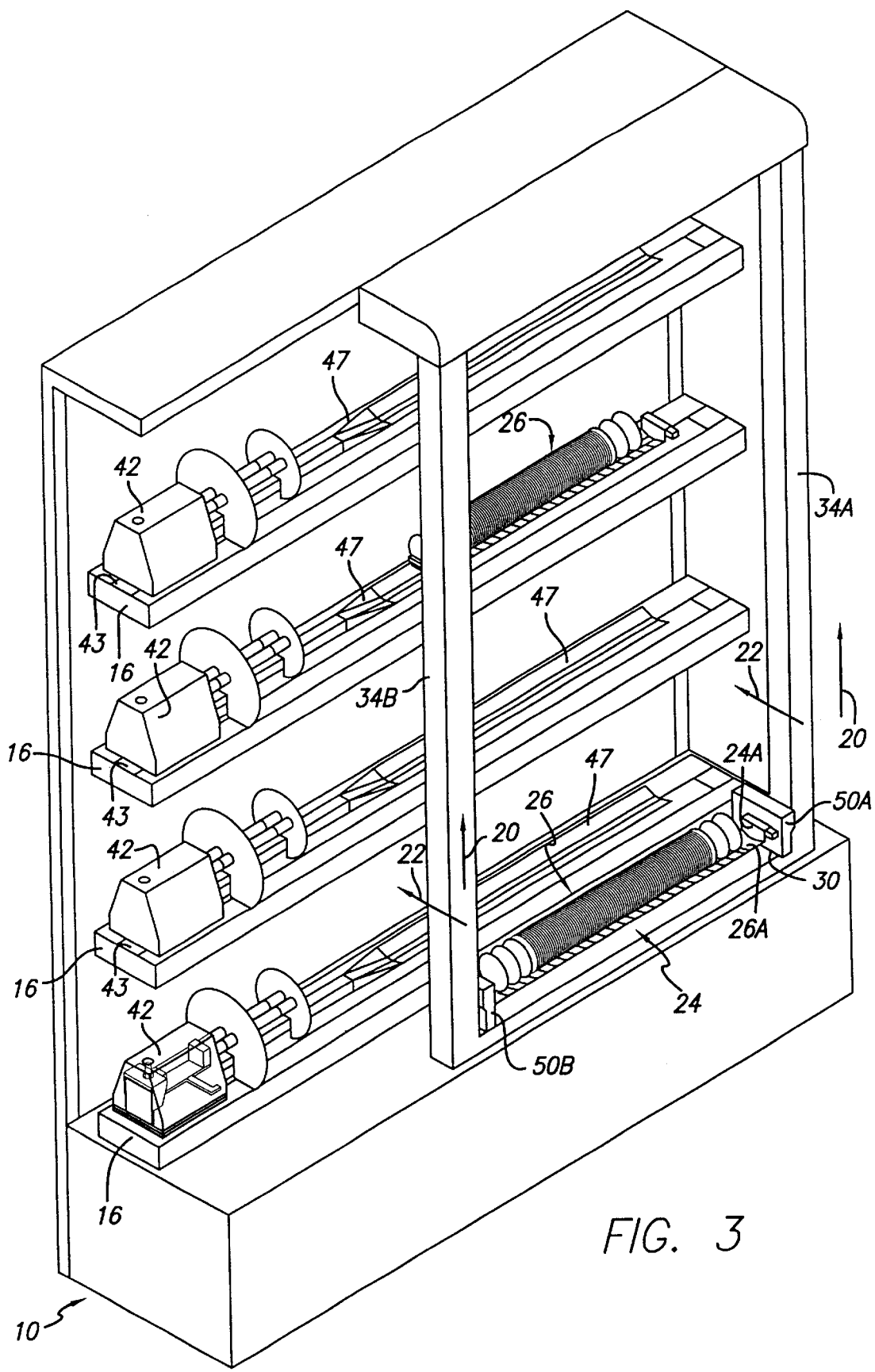
FIG. 3 is a diagram showing a plurality of boatloads of wafers supported by an intermediate carrier that is carried by the parallel Y-drive mechanisms.

Referring to FIG. 3, an intermediate silicon carbide carrier 26A is used instead of using above described wafer boat engaging mechanisms 52A and 52B of FIGS. 1A and 2A. Intermediate silicon carbide carrier 26A is provided with a hook end 26B that is supported by a receiving element 30 attached to the horizontally moveable arm (not shown) of horizontal translation mechanism 50A. A similar hook at the opposite end of intermediate carrier 26A is supported by a horizontally moveable arm of horizontal translation mechanism 50B. Typically, four to six loaded standard wafer boats (or a long boat carrying 150 or 300 semiconductor wafers then are precisely aligned with and placed on intermediate carrier 26A. If a single long boat is used, its opposite ends can be provided with hook ends that are supported by receiving elements 30, in which case the intermediate carrier 26A is not used.

The vertical translation mechanisms in elevators 34A and 34B and the horizontal translation mechanisms 50A and 50B then operate as described above with reference to FIGS. 1A–G and FIGS. 2A–C to place intermediate carrier 26A and the loaded wafer boats therein onto cantilever paddle 47. After the horizontal translation mechanisms 50A–50B have been withdrawn from the vicinity of cantilever paddle 47, the carriage 42 moves to position cantilever paddle 47 with intermediate carrier 26 and the four to six loaded wafer boats in the processing zone of an adjacent furnace tube.

An important advantage of the above described wafer loading system is that a queue mechanism of the type designated by numeral 30 in FIG. 1 of prior art U.S. Pat. No. 5,765,982 to load or unload individual wafer boats onto or off of a particular cantilever paddle is not used in the present invention. Instead, 4 to 6 wafer boats are simultaneously loaded onto a cantilever paddle or are simultaneously unloaded from the cantilever paddle in the same amount of time required for loading or unloading a single wafer boat in the prior art wafer loading systems. The amount of time required for loading and unloading wafers into the diffusion furnace therefore is reduced by a factor of four to six or more over the system shown in previously described U.S. Pat. No. 5,765,982. Furthermore, the two-elevator system of the present invention can be much less robust, less complex, and much less expensive than the single-elevator systems of the prior art which include cantilevered members to support the above-mentioned intermediate carriers which carry heavy loads of 30 to 60 pounds.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the belts and pulleys disclosed could be replaced by corresponding chains and sprockets.

What is claimed is:

1. An apparatus for automatically loading a loaded long wafer boat onto a cantilever paddle, and for automatically unloading the loaded long wafer boat from the cantilever paddle, comprising:

(a) a first cantilever paddle;

(b) a stationary first track aligned with a first opening of a furnace, and a first carriage moveable on the first track, the first carriage supporting the first cantilever paddle, (c) a first vertical translation mechanism including a first stationary part and a first vertically moveable support, and a second vertical translation mechanism including a second stationary part and a second vertically moveable support;

(d) a first horizontal translation mechanism having a first base supported by the first vertically moveable support and a first horizontally moveable arm supported by the first base, and a second horizontal translation mechanism having a second base supported by the second vertically moveable support and a second horizontally moveable arm supported by the second base;

(e) a horizontal support apparatus adapted to support the long wafer boat, the horizontal support apparatus having a first end supported by the first horizontally moveable arm and a second end supported by the second horizontally moveable arm; and (f) a controller coupled to the first and second horizontal translation mechanisms for separately controlling horizontal movement of the first and second horizontally movable arms, whereby the arms can be individually controlled to align a longitudinal axis of the wafer boat substantially parallel to a longitudinal axis of the cantilever paddle.

2. An apparatus for automatically and simultaneously loading a plurality of wafer boats onto a cantilever paddle, and for automatically and simultaneously unloading the loaded wafer boats from the cantilever paddle, comprising:

(a) a first cantilever paddle;

(b) a stationary first track aligned with a first opening of a furnace, and a first carriage moveable on the first track, the first carriage supporting the first cantilever paddle;

(c) a first vertical translation mechanism including a first stationary part and a first vertically moveable support, and a second vertical translation mechanism including a second stationary part and a second vertically moveable support;

(d) a first horizontal translation mechanism having a first base supported by the first vertically moveable support and a first horizontally moveable arm supported by the first base, and a second horizontal translation mechanism having a second base supported by the second vertically moveable support and a second horizontally moveable arm supported by the second base;

(e) a horizontal support apparatus adapted to support the plurality of wafer boats each loaded with semiconductor wafers, the horizontal support apparatus having a first end supported by the first horizontally moveable arm and a second end supported by the second horizontally moveable arm; and (f) a controller coupled to the first and second horizontal translation mechanisms for separately controlling horizontal movement of the first and second horizontally movable arms, whereby the arms can be individually controlled to align a longitudinal axis of the wafer boat substantially parallel to a longitudinal axis of the cantilever paddle.

3. The apparatus of claim 2 wherein the horizontal support apparatus includes a first wafer boat edge support mechanism having a first end supported by the first horizontally moveable arm and a second end supported by the second horizontally movable arm, and including a retractable first boat edge engaging member, and a second wafer boat edge support member having a first end supported by the first horizontally moveable arm and a second end supported by the second horizontally moveable arm and including a second boat edge engaging member, the first and second boat edge engaging members being movable to engage opposite edges of the plurality of loaded wafer boats to support them and set them directly on the cantilever paddle in cooperation with movement of the first and second horizontally moveable arms and the first and second vertical translation mechanisms, the first and second boat edge engaging members being movable to allow the first and second horizontally moveable arms to be withdrawn from the vicinity of the loaded wafer boats and the cantilever paddle.

4. The apparatus of claim 2 wherein the horizontal support apparatus includes an intermediate carrier having first and second ends removably supported by the first and second horizontally moveable arms, respectively, the plurality of loaded wafer boats resting on the intermediate carrier, the intermediate carrier with the plurality of wafer boats thereon being adapted to be set on the first cantilever paddle by movement of the first and second horizontal arm mechanisms in cooperation with movement of the first and second vertical translation mechanisms.

5. The apparatus of claim 2 wherein the first horizontal translation mechanism includes a first motor mechanism operative to move the first horizontally moveable arm relative to the first base, and a second motor mechanism operative to move the second horizontally moveable arm relative to the second base, the first and second motor mechanism being separately controllable.

6. The apparatus of claim 5 wherein the controller includes an electronic control system adapted to provide separate first and second control signals to the first and second motor mechanisms.

7. The apparatus of claim 6 including a first sensor disposed in fixed relation to the first horizontally movable arm and adapted to produce a first control signal in response to an occurrence of a first predetermined alignment of the first horizontally moveable arm with a first portion of the cantilever paddle, and a second sensor disposed in fixed relation to the second horizontally moveable arm and adapted to produce a second control signal in response to an occurrence of a second predetermined alignment of the second horizontally moveable arm with a second portion of the cantilever paddle.

8. The apparatus of claim 7 wherein the electronic control system is operative to respond to the first and second control signals to correct any misalignment of the first and second horizontally moveable arms relative to the cantilever paddle so that the plurality of wafer loads is precisely aligned with the cantilever paddle as the plurality of wafer boats are lowered onto the cantilever paddle.

9. The apparatus of claim 8 wherein the first and second sensors include first and second optical sensors, respectively.

10. The apparatus of claim 9 wherein the electronic control system operates on the first and second control signals and first and second position signals generated by position encoders in the first and second horizontal translation machines, respectively, to independently advance the first and second horizontal translation mechanisms from the locations at which the first and second sensors produce the first and second control signals, respectively, to locations such that the plurality of wafer boats are precisely aligned with a horizontal axis of the cantilever paddle.

11. The apparatus of claim 10 wherein the first and second vertical translation mechanisms are driven in response to a third motor mechanism.

12. The apparatus of claim 11 wherein the third motor mechanism is mechanically linked to move the first vertically moveable support relative to the first stationary part and to equally move the second vertically moveable support relative to the second stationary part.

13. The apparatus of claim 12 wherein the electronic control system provides a third control signal to the third motor mechanism to control the elevation of the first and second horizontally moveable supports and hence of the loaded wafer boats.

14. The apparatus of claim 13 wherein the electronic control system includes a programmed microcontroller.

15. The apparatus of claim 14 wherein each paddle is composed of silicon carbide.

16. The apparatus of claim 13 including a plurality of cantilever paddles supported by a plurality of carriages moveable on a plurality of tracks, respectively, and aligned with a corresponding opening of the furnace.

17. The apparatus of claim 16 wherein each paddle is slotless.

18. The apparatus of claim 9 wherein the electronic control system stops movement of one of the first and second horizontally moveable arms in response to the one of the first and second control signals that indicates a desired alignment of the one of the first and second horizontally moveable arms, the other of the first and second horizontally moving arms continuing to move to correct a misalignment with respect to the cantilever paddle.

19. An apparatus for automatically and simultaneously loading a plurality of wafer boats onto a cantilever paddle, and for automatically and simultaneously unloading the loaded wafer boats from the cantilever paddle, comprising:
   (a) a first cantilever paddle;
   (b) a stationary first track aligned with a first opening of a furnace, and a first carriage moveable on the first track, the first carriage supporting the first cantilever paddle;
   (c) a first vertical translation mechanism including a first stationary part and a first vertically moveable support, and a second vertical translation mechanism including a second stationary part and a second vertically moveable support;
   (d) a first horizontal translation mechanism having a first base supported by the first vertically moveable support and a first horizontally moveable arm supported by the first base, and a second horizontal translation mechanism having a second base supported by the second vertically moveable support and a second horizontally moveable arm supported by the second base; and
   (e) a horizontal support apparatus adapted to support a plurality of wafer boars each loaded with semiconductor wafers, the horizontal support apparatus having a first end supported by the first horizontally moveable arm and a second end supported by the second horizontally moveable arm,
   wherein the first stationary part includes first and second pulleys and the first vertically moveable support includes a first belt disposed on the first and second pulleys, and the second stationary part includes third and fourth pulleys and a second belt, the first pulley being driven by the third motor mechanism, the second pulley being driven by the first pulley and the first belt, the third pulley being driven by the second pulley and a common shaft connecting the second and third pulleys, the fourth pulley being driven by the third pulley and the second belt.

20. The apparatus of claim 19 including a slip-clutch and an over-running coupler connected to one of the first, second, third and fourth pulleys wherein the over-running coupler decouples the one of the pulleys from the slip-clutch while the first and second vertically moveable supports are being raised and couples the one of the pulleys to the slip-clutch while the first and second vertically moveable supports are being lowered so as to effectively counterbalance the lowering of the first and second vertically moveable supports.

21. An apparatus for automatically and simultaneously loading a plurality of wafer boats onto a cantilever paddle, and for automatically and simultaneously unloading the loaded wafer boats from the cantilever paddle, comprising:
   (a) first cantilever paddle;
   (b) a stationary first track aligned with a first opening of a furnace, and a first carriage moveable on the first track, the first carriage supporting the first cantilever paddle;
   (c) a first vertical translation mechanism including a first stationary part and a first vertically moveable support, and a second vertical translation mechanism including a second stationary part and a second vertically moveable support;
   (d) a first horizontal translation mechanism having a first base supported by the first vertically moveable support and a first horizontally moveable arm supported by the first base, and a second horizontal translation mechanism having a second base supported by the second vertically moveable support and a second horizontally moveable arm supported by the second base; and
   (e) a horizontal support apparatus adapted to support a plurality of wafer boats each loaded with semiconductor wafers, the horizontal support apparatus having a first end supported by the first horizontally moveable arm and a second end supported by the second horizontally moveable arm,
   wherein the horizontal support apparatus includes a first wafer boat edge support mechanism having a first end supported by the first horizontally moveable arm and a second end supported by the second horizontally moveable arm, and including at least one retractable boat edge supporting member, and a second wafer boat edge support member having a first end supported by the first horizontally moveable arm and a second end supported by the second horizontally moveable arm, the retractable boat edge engaging member being extendable to edge is of the plurality of loaded wafer boats to support them and set them directly on the cantilever paddle in cooperation with movement of the first and second horizontally moveable arms and the first and second vertical translation mechanisms, the retractable boat edge engaging member being retractable to allow the first and second horizontally moveable arms to be withdrawn from the vicinity of the loaded wafer boats and the cantilever paddle,
   and wherein the first wafer boat edge support mechanism includes a rotatable member having a first end rotatably supported by the first horizontally moveable arm and a second end rotatably supported by the second horizontally moveable arm, and a retractable member connected to the retractable member so an outer portion of the first retractable member moves to engage edge portions of the wafer boats.

22. A method of automatically loading a plurality of wafer boats onto a cantilever paddle, comprising:
   (a) providing first and second vertical translation devices having first and second vertically moveable supports, respectively, and also providing a first horizontal translation device having both a first base attached to the first vertically moveable support and a first horizontally moveable arm, and a second horizontal translation device having both a second base attached to the second vertically moveable support and a second horizontally moveable arm;

(b) supporting a first end of each of a first wafer boat edge that support mechanism and a second wafer boat edge support mechanism by means of the first horizontally moveable arm, and supporting a second end of each of the first and second wafer boat edge support mechanisms by means of the second horizontally moveable arm;

(c) moving a first boat edge engaging member of the first wafer boat edge support mechanism to engage a first edge of each of the plurality of wafer boats, and moving a second boat edge engaging member of the second wafer boat edge support mechanism to engage a second edge of each of the plurality of wafer boats;

(d) operating the first and second vertical translation devices to raise the first and second horizontal translation devices and the plurality of wafer boats to a first elevation adjacent to the cantilever paddle;

(e) controlling the first and second horizontal translation devices individually to move the first and second horizontally moveable arms to first and second positions, respectively, proximate to the cantilever paddle, whereby the arms can be individually controlled to align a longitudinal axis of the wafer boat substantially parallel to a longitudinal axis of the cantilever paddle;

(f) lowering the wafer boat onto the cantilever paddle; and (g) moving the first and second boat edge engaging mechanisms to clear the first and second edges of the wafer boats and withdrawing the first and second horizontally moveable arms from the vicinity of the horizontal wafer boat support.

23. The method of claim 22 including providing first and second sensors in fixed relation to the first and second horizontally moveable arms, respectively, and operating the first sensor to produce a first control signal when a first point of the first horizontally moveable arm is aligned with an axis of the cantilever paddle and stopping horizontal movement of the first horizontally moveable arms in response to the first control signal, and operating the second sensor to produce a second control signal when a second point of the second horizontally moveable arm is aligned to the axis and stopping horizontal movement of the second horizontally moveable arm in response to the second control signal, so as to precisely align the horizontal wafer boat support with the cantilever paddle before step (e).

24. A method of automatically loading a plurality of wafer boats onto a cantilever paddle, comprising:

(a) providing first and second vertical translation devices having first and second vertically moveable supports, respectively, and also providing a first horizontal translation device having both a first base attached to the first vertically moveable support and a first horizontally moveable arm, and a second horizontal translation device having both a second base attached to the second vertically moveable support and a second horizontally moveable arm;

(b) supporting the plurality of wafer boats on horizontal wafer boat support and supporting opposite ends of the horizontal wafer boat support by the first and second horizontally moveable arms;

(c) operating the first and second vertical translation devices individually to raise the first and second horizontal translation devices to a first elevation adjacent to the cantilever paddle;

(d) controlling the first and second horizontal translation devices to move the first and second horizontally moveable arms to first and second positions, respectively, proximate to the cantilever paddle, whereby the arms can be individually controlled to align a longitudinal axis of the wafer boat substantially parallel to a longitudinal axis of the cantilever paddle; and (e) lowering the horizontal wafer boat support onto the cantilever paddle and then withdrawing the first and second horizontally moveable arms from the vicinity of the horizontal wafer boat support.

25. The method of claim 24 including providing first and second sensors in fixed relation to the first and second horizontally moveable arms, respectively, and operating the first sensor to produce a first control signal when a first point of the first horizontally moveable arm is aligned with an axis of the cantilever paddle and controlling horizontal movement of the first horizontally moveable arm in response to the first control signal, and operating the second sensor to produce a second control signal when a second point of the second horizontally moveable arm is aligned to the axis and controlling horizontal movement of the second horizontally moveable arm in response to the second control signal, so as to precisely align the horizontal wafer boat support with the cantilever paddle before step (e).

26. A method of automatically loading at least one wafer boat onto a cantilever paddle, comprising:

(a) providing first and second vertical translation devices having first and second vertically moveable supports, respectively, and also providing a first horizontal translation device having both a first base attached to the first moveable support and a first horizontally moveable arm, and a second horizontal translation device having both a second base attached to the second moveable support and a second horizontally moveable arm;

(b) supporting a first end of each of a first wafer boat edge support mechanism and a second wafer boat edge support mechanism by means of the first horizontally moveable arm, and supporting a second end of each of the first and second wafer boat edge support mechanisms by means of the second horizontally movable arm;

(c) advancing at least a first boat edge engaging member of the first wafer boat edge support mechanism to engage a first edge of the wafer boat, and advancing at least a second boat edge engaging member of the second wafer boat edge support mechanism to engage a second edge of each of the wafer boat;

(d) controlling the first and second vertical translation devices individually to raise the first and second horizontal translation devices and the wafer boat to a first elevation adjacent to the cantilever paddle;

(e) operating the first and second horizontal translation devices to move the first and second horizontally moveable arms to first and second positions, respectively, proximate to the cantilever paddle, whereby the arms can be individually controlled to align a longitudinal axis of the wafer boat substantially parallel to a longitudinal axis of the cantilever paddle;

(f) lowering the wafer boat onto the cantilever paddle; and (g) retracting at least the first and second boat edge engaging mechanisms to clear the first and second edges of the wafer boat and withdrawing the first and second horizontally moveable arms from the vicinity of the horizontal wafer boat support.

27. A method of automatically loading at least one wafer boat onto a cantilever paddle, comprising:

(a) providing first and second vertical translation devices having first and second vertically moveable supports, respectively, and also providing a first horizontal translation device having both a first base attached to the first vertically moveable support and a first horizontally moveable arm, and a second horizontal translation device having both a second base attached to the second vertically moveable support and a second horizontally moveable arm;

(b) supporting the wafer boat on horizontal wafer boat support and supporting opposite ends of the horizontal wafer boat support by the first and second horizontally moveable arms;

(c) operating the first and second vertical translation devices to raise the first and second horizontal translation devices to a first elevation adjacent to the cantilever paddle;

(d) controlling the first and second horizontal translation devices to individually move the first and second horizontally moveable arms to first and second positions, respectively, proximate to the cantilever paddle, whereby the arms can be individually controlled to align a longitudinal axis of the wafer boat substantially parallel to a longitudinal axis of the cantilever paddle; and (e) lowering the horizontal wafer boat support onto the cantilever paddle and then withdrawing the first and second horizontally moveable arms from the vicinity of the horizontal wafer boat support.

28. An apparatus for automatically and simultaneously loading at least one loaded wafer boat onto a cantilever paddle, and for automatically and simultaneously unloading the loaded wafer boat from the cantilever paddle, comprising:

(a) a first cantilever paddle;

(b) a stationary first track aligned with a first opening of a furnace, and a first carriage moveable on the first track, the first carriage supporting the first cantilever paddle;

(c) a first vertical translation mechanism including a first stationary part and a first vertically moveable support, and a second vertical translation mechanism including a second stationary part and a second vertically moveable support;

(d) a first horizontal translation mechanism having a first base supported by the first vertically moveable support and a first horizontally moveable arm supported by the first base, and a second horizontal translation mechanism having a second base supported by the second vertically movable support and a second horizontally moveable arm supported by the second base, opposite ends of the wafer boat being supported by the first and second horizontal moveable arms; and (e) a controller coupled to the first and second horizontal translation mechanisms for individually controlling horizontal movement of the first and second horizontally movable arms, whereby the arms can be individually controlled to align a longitudinal axis of the wafer boat substantially parallel to a longitudinal axis of the cantilever paddle.

* * * * *